(12) United States Patent
Sawayanagi

(10) Patent No.: US 6,280,246 B1
(45) Date of Patent: Aug. 28, 2001

(54) SECURING STRUCTURE OF CONNECTOR

(75) Inventor: Masahiro Sawayanagi, Shizuoka-ken (JP)

(73) Assignee: Yazaki Corporation, Tokyo (JP)

( * ) Notice: Subject to any disclaimer, the term of this patent is extended or adjusted under 35 U.S.C. 154(b) by 0 days.

(21) Appl. No.: 09/644,692

(22) Filed: Aug. 24, 2000

(30) Foreign Application Priority Data

Aug. 25, 1999 (JP) .................................................. 11-238837

(51) Int. Cl.[7] .................................................. H01R 13/60
(52) U.S. Cl. .......................................... 439/567; 439/575
(58) Field of Search ..................................... 439/567, 566, 439/571, 572, 573, 574, 575, 564, 79, 80, 326

(56) References Cited

U.S. PATENT DOCUMENTS

| | | | |
|---|---|---|---|
| 4,676,565 | * 6/1987 | Reichardt | 439/79 |
| 5,586,008 | * 12/1996 | Kozel et al. | 439/743 |
| 5,622,508 | * 4/1997 | Nagahata et al. | 439/79 |
| 5,700,159 | * 12/1997 | Albeck | 439/571 |

FOREIGN PATENT DOCUMENTS 6-60067    8/1994   (JP) .

* cited by examiner

*Primary Examiner*—Tulsidas Patel
(74) *Attorney, Agent, or Firm*—Finnegan, Henderson, Farabow, Garrett & Dunner, L.L.P.

(57) ABSTRACT

One ends 12a of terminals 12S, 12T projecting outward from a connector housing 11 are inserted through terminal through holes 22 formed in a board 20 and secured to the board 20 by soldering. Each of the tip ends of the terminal 12T closer to the one end 12a is formed with a hook 13 which is folded into inverted V-shape, the hook 13 is inserted through the terminal through hole 22 of the board 20, and the tip end 13a of the hook 13 is engaged with a face 20a of the board 20 around the terminal through hole 22.

15 Claims, 5 Drawing Sheets

SECURING STRUCTURE OF CONNECTOR

BACKGROUND OF THE INVENTION

1. Field of the Invention

The present invention relates to a securing structure suitable for securing a connector housing having a plurality of terminals to a printed board for example.

2. Description of Related Art

As a securing structure for a connector of this kind, there are proposed a solder-securing type structure shown in FIGS. 1 to 3, and a screw-securing type structure shown in FIG. 4.

As shown in FIGS. 1 to 3, a solder-securing type connector 1 includes a box-like female connector housing 2 provided with substantially U-shaped male terminals 3 projecting from inside to outside of the housing 2 in a plurality of rows.

One ends 3a of the male terminals 3 projecting outside from the connector housing 2 are allowed to pass through terminal through holes 4a formed in a printed board 4 and secured to the printed board 4 (this portion is shown with a symbol H in the drawings) by solder. The other ends 3b of the terminals 3 exposed inside of the connector housing 2 are fitted into female terminals (not shown) of a companion male connector 5 to which a wire harness is connected.

In the case of a screw-securing type connector 6, as shown in FIG. 4, the connector 6 includes a box-like female connector housing 7 provided with substantially bar-like male terminals 8 projecting from inside to outside of the housing 7 in a plurality of rows. A pair of flanges 7a and 7a projecting from opposite sides of the connector housing 7 are respectively provided with screw inserting holes 7b and 7b.

When the connector 6 is secured to the printed board 4, one ends 8a of the terminals 8 are allowed to pass through terminal through holes 4a of the printed board 4 and in this state, screws 9a are inserted through screw-insertion holes 7b of the pair of flanges 7a and 7a, and through screw-insertion holes 4b and 4b of the printed board 4, and the connector 6 and the printed board 4 are fastened and secured to each other through nuts 9b and 9b.

A similar technique concerning the securing structure of the solder-securing type connector 1 is disclosed in Japanese Utility Model Application Laid-open No. H6-60067.

However, in the case of the above-described conventional securing structure of the solder-securing type connector 1, an operator must keep holding the connector 1 with his or her hand or a jig etc., so that the connector 1 will not come off until the soldering operation is completed, and the operability is inferior. Further, as shown in FIG. 3, the connector 1 and the printed board 4 is secured to each other while a gap t remains therebetween in some cases, and the reliability is inferior.

Further, in the case of the securing structure of the screw-securing type connector 6, the plurality of separate parts exclusively used for securing operation such as the screws 9a, 9a and the nuts 9b, 9b are absolutely necessary and thus, the number of parts is increased, and the weight and cost are increased.

SUMMARY OF THE INVENTION

The present invention has been accomplished to solve the above problems, and it is an object of the invention to provide a securing structure of a connector having excellent operability and reliability in which the number of parts is reduced, its weight and cost are reduced, and a connector housing can easily and reliably be secured to a board.

According to a first aspect of the invention, there is provided a securing structure of a connector: comprising a connector housing; a terminal projecting outside from the connector housing; and a board having a terminal through hole through which one end of the terminal is inserted; wherein a tip end of the terminal closer to one end is formed with a hook which is bent into inverted V-shape, the hook is passed through the terminal through hole of the board, a tip end of the hook is engaged with a face of the board around the terminal through hole and secured to the board by soldering.

According to this securing structure of the connector, when the connector housing is secured to the board, the hook on the one end of the terminal projecting outward from the connector housing is inserted through the terminal through hole and engaged with the face of the board, the connector housing can be temporarily be secured to the board by inserting the hook on the one end of the terminal projecting outward from the connector housing through the terminal through hole and engaged with the face of the board. Therefore, the one end of the terminal and the board can easily and reliably be soldered to each other. Thus, separate parts used exclusively for securing operation are unnecessary, the number of parts can be reduced correspondingly, the entire weight and costs can be reduced, and the operability and the reliability can be enhanced.

Especially, since the engagement is achieved by the hook 13 which was folded into V-shape, the engagement is less prone to be disengaged, and the temporarily securing force is strong. Thus, if the hook once engages, the temporarily secured state is not disengaged nor loosened, and the soldering operation is facilitated. Further, since the entire hook including space (gap) inside the hook is soldered, the amount of solder is increased, and soldering strength and conductivity are improved.

According to a second aspect of the invention, in the securing structure of a connector of the first aspect, the terminal is made resiliently deformable by bending the entire terminal into substantially U-shape, and the connector housing is biased and pushed against the board by resilience of the entire terminal and resilience of the hook.

According to this securing structure of the connector, the connector housing is pushed and biased toward the board by the resilience of the entire male terminals and the resilience of the hooks, no gap is generated between the connector housing and the printed board when they are temporarily secured to each other, the connector housing can easily and reliably be secured to the board temporarily, and faulty solder is not caused.

According to a third aspect of the invention, in the securing structure of a connector of the first aspect, the terminal is provided plurally and arranged in the connector housing in a plurality of rows, a pair of terminals of the plurality of terminals located at opposite ends of the connector housing are formed with the hooks, the hooks of the pair of terminals are inserted through terminal inserted holes formed in opposite ends of the connector housing and then, the hooks are projected toward the board.

According to this securing structure of the connector, since the hooks of the pair of terminals located at the opposite ends of the connector housing are reliably positioned into the terminal through holes of the board through the terminal insertion holes, it is possible to easily and reliably secure the connector housing to the board temporarily, and the operability and the reliability can further be enhanced.

DESCRIPTION OF THE PREFERRED EMBODIMENT

An embodiment of the present invention will be explained based on the drawings below.

As shown in FIGS. 5 to 8, a connector 10 includes a box-like female connector housing 11 made of resin. Male terminals 12S, 12T bent into substantially U-shape are disposed from inside to outside of the housing 11 in a plurality of rows in the connector housing 11.

Figure 6:
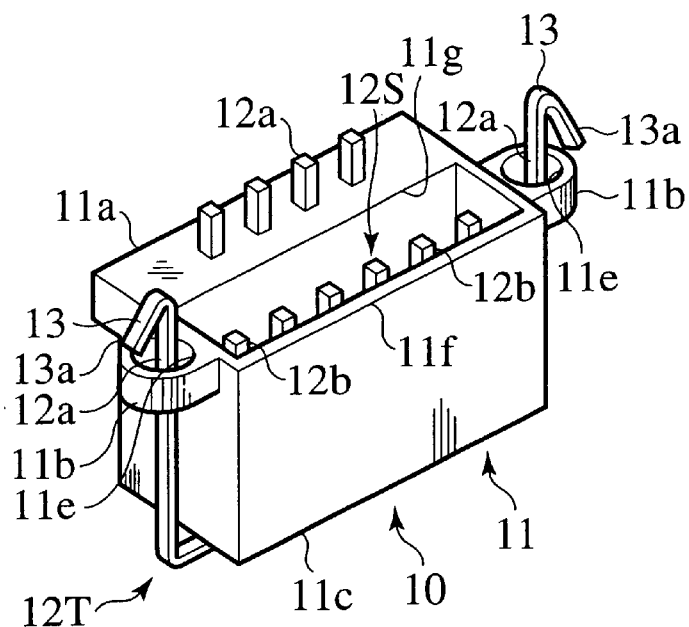
FIG. 6 is a perspective view of the connector of the embodiment of the invention.

As shown in FIG. 6, an array plate 11a is integrally projecting outward from one long side of an opening 11g of the connector housing 11. Tongue-like flanges 11b and 11b are integrally projecting from opposite short sides of the connector housing 11. One ends 12a of a plurality of male terminals 12S located on the array plate 11a (except male terminals 12T, 12T on opposite sides of the array plate 11a) are integrally formed on the array plate 11a by insert forming. The one ends 12a project outside of the connector housing 11. The other ends 12b of the male terminals 12S, 12T are integrally formed on a bottom 11c of the connector housing 11 by insert forming and project into inside 11d of the connector housing 11.

The pair of flanges 11b and 11b are respectively formed with terminal insertion holes 11e and 11e. One ends 12a, 12a of the pair of male terminals 12T, 12T located at the opposite ends of the connector housing 11 are inserted through the terminal insertion holes 11e, 11e. A tip end of each of the opposite male terminals 12T closer to the one ends 12a projecting outside from the connector housing 11 is folded into V-shape, thereby forming a hook 13. A tip end 13a of the hook 13 is directed outward and diagonally downward. The hooks 13 are inserted through the terminal insertion holes 11e, 11e of the flanges 11b and 11b on the opposite ends of the connector housing 11 and then, the folded portions are projected upward of the connector housing 11 in the attitude that the folded portions are directed upward.

Figure 1:
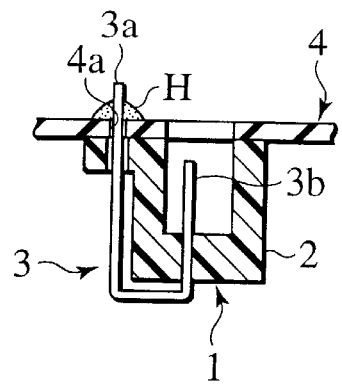
FIG. 1 is a sectional view of a conventional connector secured to a board.
Figure 2:
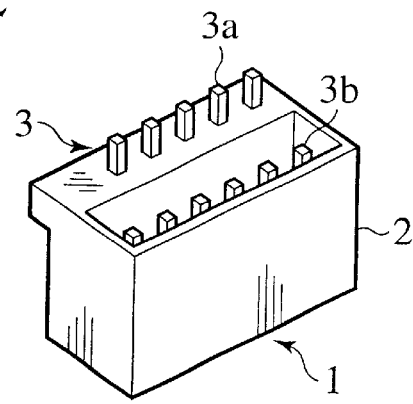
FIG. 2 is a perspective view of the conventional connector.
Figure 3:
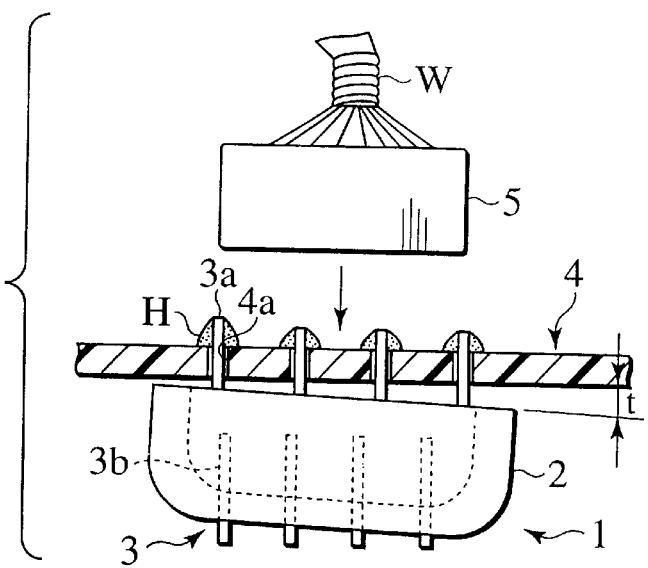
FIG. 3 is a partially sectional front view for showing a problem of the conventional connector secured to the board.
Figure 4:
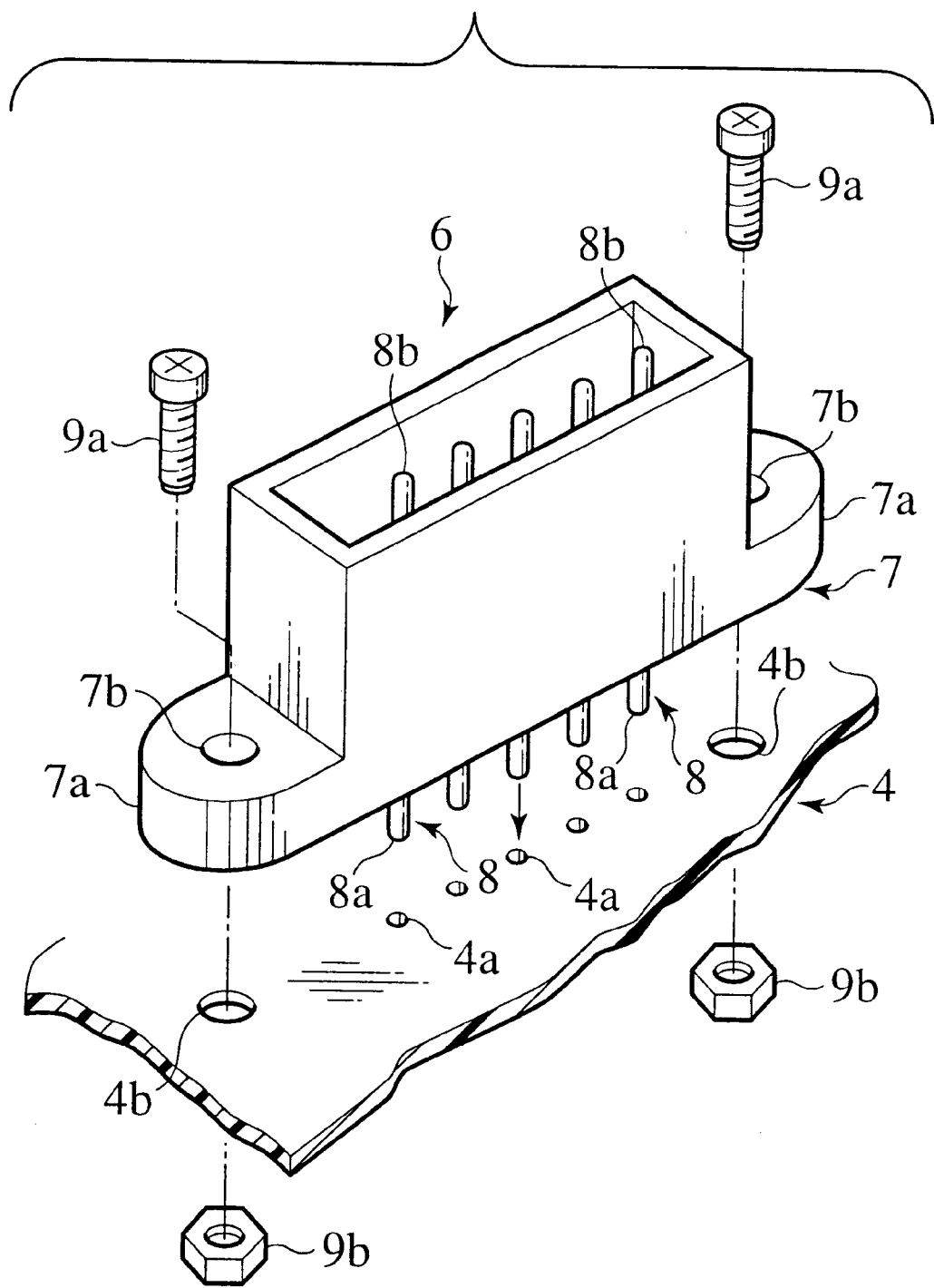
FIG. 4 is a perspective view of another conventional connector before it is secured to a board.
Figure 5:
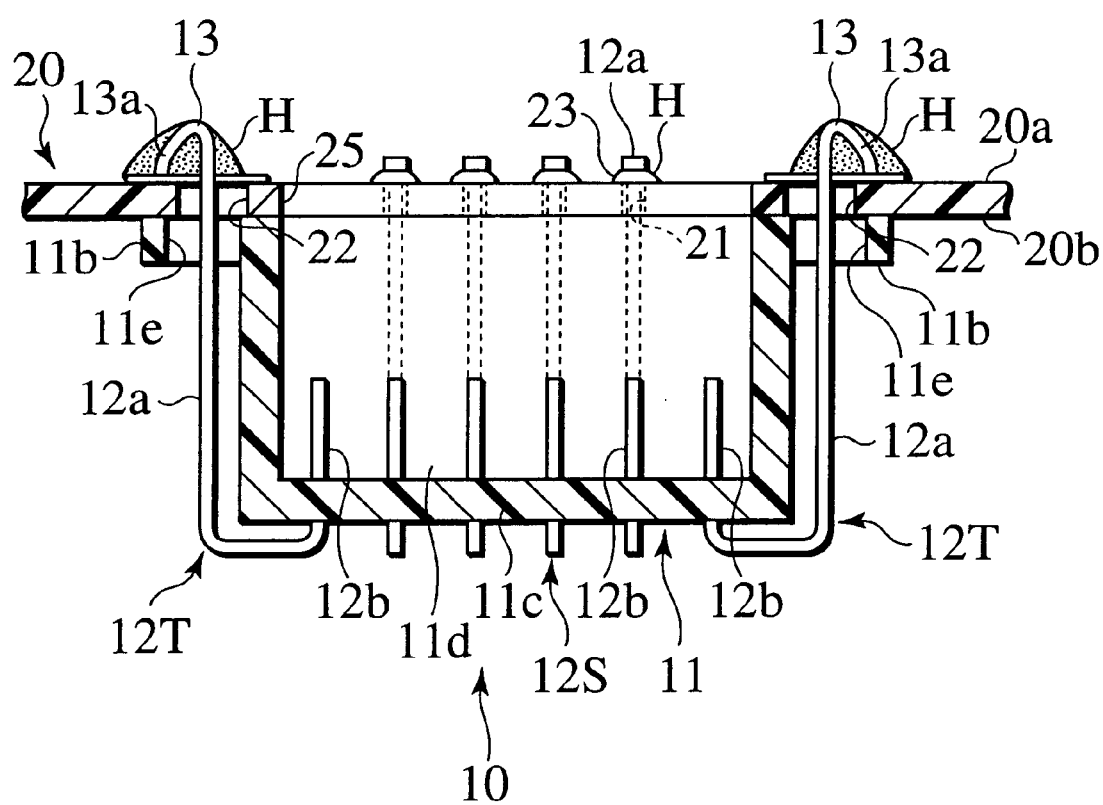
FIG. 5 is a sectional view of a securing structure of a connector of an embodiment of the present invention.

One ends 12a of the male terminals 12S projecting outside from the connector housing 11 and the hooks 13 of the pair of male terminals 12T, 12T are respectively inserted through the terminal through holes 21, 22 formed in the printed board 20 and in this state, the one ends 12a and the hooks 13 are soldered to conductive patterns 23 and 24 formed on upper faces 20a around the terminal through holes 21, 22 of the printed board 20 (these portions are shown with symbols H in FIG. 5).

Figure 7:
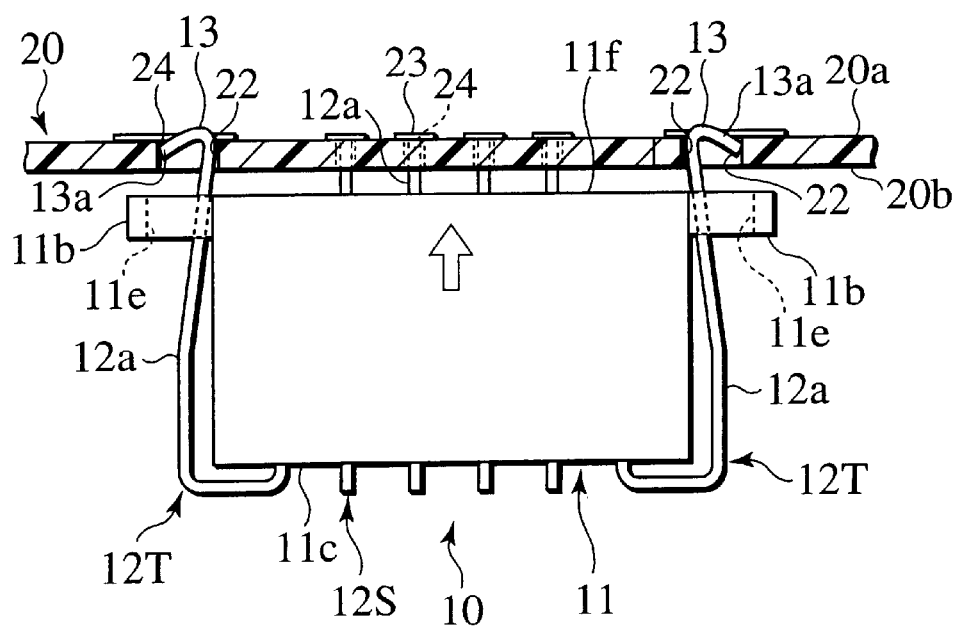
FIG. 7 is a partial sectional front view of a state in which a connector housing is halfway secured to the board temporarily.

When the hooks 13 of the male terminals 12T, 12T on the opposite ends are inserted through the terminal through holes 22, 22 of the printed board 20, since each the entire male terminal 12T is bent into substantially U-shape such that the male terminal can resiliently be deformed, and since each the hook 13 itself can resiliently be deformed, the hooks 13 pass through the terminal through holes 22 of the printed board 20 while being deformed as shown in FIG. 7. After the hooks 13 passed through the holes 22, the hooks 13 restore their original positions and shapes, and as shown in FIG. 8, tip ends 13a of the hooks 13 engages the upper faces 20a of the printed board 20 around the terminal through holes 22, and the connector housing 11 is temporarily secured.

In this temporarily secured state, the connector housing 11 is biased and pushed against the printed board 20 by resilience of the entire male terminals 12T an the hooks 13, an upper face 11f of the connector housing 11 is brought into tight contact with and abutment against a lower face 20b of the printed board 20 without gap.

The male terminals 12S arranged on the rectangular array plate 11a in one row and the male terminals 12T on the opposite ends of the connector housing 11 are arranged such as to intersect with each other substantially at right angles. The printed board 20 is formed with a rectangular opening 25 at a location thereof corresponding to the opening 11g of the connector housing 11.

Figure 8:
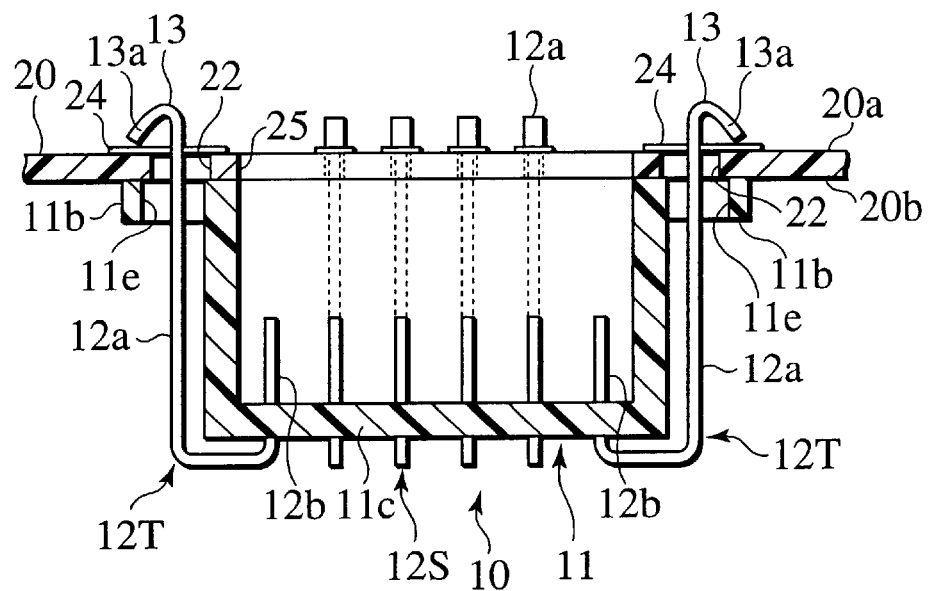
FIG. 8 is a sectional view of a state in which the connector housing is secured to the board temporarily.

According to the securing structure of a connector having the above-described structure, when the connector housing 11 is secured to the printed board 20, the hooks 13 of the male terminals 12T projecting from the opposite ends of the connector housing 11 can upwardly pass through the pair of terminal through holes 22 of the printed board 20 by pushing the connector housing 11 toward the printed board 20 as shown in FIGS. 7 and 8. After the hooks 13 passed therethrough, the tip ends 13a of the hooks 13 engage the upper faces 20a of the printed board 20 around the terminal through holes 22, and the connector housing 11 can temporarily be secured to the printed board 20.

Especially, since the engagement is achieved by the hook 13 which was folded into V-shape, the engagement is less prone to be disengaged, and the temporarily securing force is enhanced. Thus, the hook once engages, the temporarily secured state is not disengaged nor loosened. Therefore, an operator need not hold the connector housing 11 by his or her hand, a jig or the like. Further, since the connector housing 11 is held down against the printed board 20 by the resilience of the entire male terminals 12T and the resilience of the hooks 13, no gap is generated between the connector housing 11 and the printed board 20.

Figure 9A:
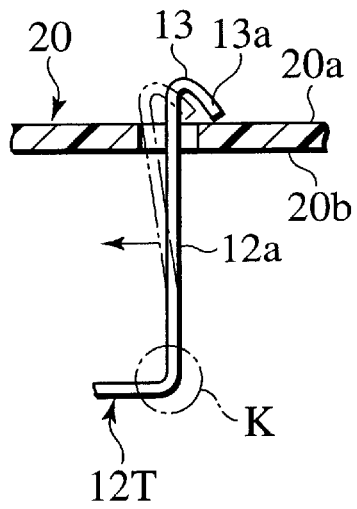
FIG. 9A is a partial sectional view for explaining the operation of the temporary securing operation.
Figure 9B:
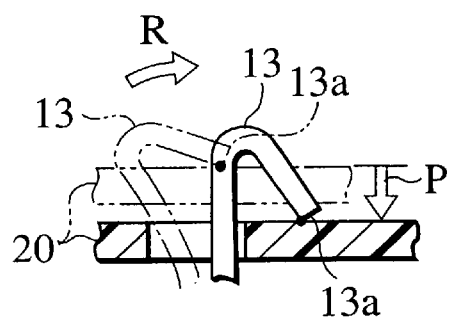
FIG. 9B is an enlarged view of an essential portion of FIG. 9A.

If a force for generating a gap between the connector housing 11 and the printed board 20 is applied for example, the one ends 12 of the male terminals 12T are bent downward around bent points K as shown in FIG. 9A, but since restoration force is generated in each the male terminal 12T itself as shown with an arrow R in accordance with the deformation of the male terminal 12T as shown in FIG. 9B, a force for pushing down the printed board 20 is generated in the tip ends 13a of the hooks 13 by the restoration force R, and the connector housing 11 is relatively lifted up, and the generation of the gap is restrained.

Since the connector housing 11 can be temporarily be secured to the printed board 20 in this manner, it is possible to easily and reliably solder the one ends 12a of the terminals 12S, 12T to the conductive patterns 23, 24 of the printed board 20. Further, separate parts (such as a bolt and a nut) used exclusively for securing operation are unnecessary, the number of parts can be reduced correspondingly, the entire weight and costs can be reduced, and the operability and the reliability can be enhanced.

Further, since the hooks 13 are provided on the male terminals 12T on the opposite ends of the connector housing 11 closer to the one ends 12a, a face for soldering and connecting is widened as compared with one end of a conventional male terminal which is straight entirely. For example, since the entire hook 13 including space (gap) inside the hook 13 is soldered, the amount of solder is increased, a holding force of the connector housing 11 is stronger than that of the conventional technique, and the conductivity is improved.

Furthermore, since the connector housing 11 and the printed board 20 can temporarily be secured to each other without generating a gap therebetween, the connector housing 11 can reliably be soldered to the printed board 20 with high precision, and faulty solder is not caused.

Further, since the hooks 13 of the pair of male terminals 12T located at the opposite ends of the connector housing 11 can reliably be positioned into the pair of terminal through holes 22 of the printed board 20 through the pair of terminal insertion holes 11e formed at the opposite ends of the connector housing 11, it is possible to easily and reliably secure the connector housing 11 to the printed board 20 temporarily, and the operability and the reliability can further be enhanced.

What is claimed is:

1. A secured connector assembly, comprising:

a connector housing having first and second ends;

a terminal projecting from one of said ends of said connector housing; and a board having a terminal through hole through which a distal end of said terminal is inserted;

wherein a tip end of distal end of said terminal includes a hook bent into an inverted V-shape, said hook passing through said terminal through hole of said board, a tip end of said hook engaging a face of said board around said terminal through hole to bias said connector housing against said board such that said housing is in contact with said board, said tip end of said hook being secured to said board by soldering.

2. A secured connector assembly according to claim 1, wherein said terminal is resiliently deformable and bent substantially into a U-shape, said connector housing being biased and pushed against said board by the resilience of said terminal and hook.

3. A secured connector assembly according to claim 1, wherein a plurality of terminals, including a pair of end terminals, are provided and arranged in said connector housing, one of the pair of end terminals being located at each said end of said connector housing, the end terminals each including a hook, each said hook of said pair of terminals being inserted through terminal insertion holes formed in opposite ends of the connector housing and projecting toward said board.

4. A secured connector assembly according to claim 2, wherein a plurality of terminals, including a pair of end terminals, are provided and arranged in said connector housing, one of the pair of end terminals being located at each said end of said connector housing, the end terminals each including a hook, each said hook of said pair of terminals being inserted through terminal insertion holes formed in opposite ends of the connector housing and projecting toward said board.

5. A method of securing a connector housing to a printed circuit board, comprising:

providing a connector housing having first and second ends, and a terminal projecting from one of said ends;

providing a board having at least one terminal through hole;

bending an end of said terminal to form a hook at a tip portion of said terminal; and passing said hook of said terminal through said terminal through hole of said board such that a tip of said hook engages a face of said board to bias said connector housing toward said board to bring said housing into contact with said board.

6. A method of securing a connector housing to a printed circuit board according to claim 5, further comprising forming the terminal substantially into a U-shape.

7. A method of securing a connector housing to a printed circuit board according to claim 5, further comprising bending an end of a second terminal projecting from the other end of said connector housing to form a hook at a tip portion of said second terminal.

8. A method of securing a connector housing to a printed circuit board according to claim 7, further comprising passing said hook of said second terminal through a second terminal through hole of said board such that a tip of said hook of said second terminal engages a face of said board to bias said connector housing toward said board to eliminate any gaps between said connector housing and said board.

9. A method of securing a connector housing to a printed circuit board according to claim 5, further comprising soldering the tip portion of the hook to the board.

10. A method of securing a connector housing to a printed circuit board according to claim 8, further comprising soldering the tip portion of the hook of the second terminal to the board.

11. A secured connector assembly comprising:

a connector housing having first and second ends;

first and second terminals projecting from said first and second ends, respectively, of said connector housing, each said terminal including a free end having a hooked end portion; and a printed circuit board including terminal through holes;

wherein the hooked end portions of said terminals pass through said terminal through holes to bias said connector housing toward said board such that said housing contacts said board.

12. A secured connector assembly according to claim 11, wherein each said terminal is substantially U-shaped.

13. A secured connector assembly according to claim 11, wherein each said terminal is resiliently deformable.

14. A secured connector assembly according to claim 11, wherein a tip portion of each hooked end portion of the terminals engages a face of the board to bias the connector toward the board.

15. A secured connector assembly according to claim 14, wherein each of the tip portions are soldered to the board.

* * * * *